United States Patent
Hsu et al.

(10) Patent No.: US 8,239,056 B2
(45) Date of Patent: Aug. 7, 2012

(54) ADVANCED PROCESS CONTROL FOR NEW TAPEOUT PRODUCT

(75) Inventors: Chih-Wei Hsu, Chuang-Hua (TW); Yu-Jen Cheng, Hsinchu (TW); Wen-Pin Liu, Hsin-Chu (TW); Shun-Ping Wang, Hsin-Chu (TW); Shin-Rung Lu, Chu-Pei (TW); Jo Fei Wang, Hsin-Chu (TW); Jong-I Mou, Hsinpu Township, Hsinchu County (TW); Andy Tsen, Chung-Ho (TW); Chun-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 311 days.

(21) Appl. No.: 12/616,681

(22) Filed: Nov. 11, 2009

(65) Prior Publication Data

US 2011/0112678 A1     May 12, 2011

(51) Int. Cl.
*G06F 19/00* (2011.01)
(52) U.S. Cl. ........................................ 700/121; 700/103
(58) Field of Classification Search .................. 700/110, 700/109, 102, 104, 121, 103; 438/40
See application file for complete search history.

(56) References Cited

U.S. PATENT DOCUMENTS

| | | | | |
|---|---|---|---|---|
| 6,000,830 A * | 12/1999 | Asano et al. | ................... | 700/121 |
| 6,035,293 A * | 3/2000 | Lantz et al. | ............................ | 1/1 |
| 6,438,441 B1 * | 8/2002 | Jang et al. | ..................... | 700/121 |
| 6,748,288 B2 * | 6/2004 | Su et al. | ......................... | 700/108 |
| 7,353,078 B2 * | 4/2008 | Chung et al. | ................... | 700/121 |
| 2006/0004786 A1 * | 1/2006 | Chen et al. | ..................... | 707/100 |
| 2007/0129839 A1 * | 6/2007 | Tsubakida et al. | ............ | 700/121 |
| 2008/0148216 A1 * | 6/2008 | Chan et al. | ....................... | 716/19 |

FOREIGN PATENT DOCUMENTS

| CN | 101231508 | 7/2008 |
|---|---|---|
| CN | 101465277 | 6/2009 |

OTHER PUBLICATIONS

Chinese Patent Office, Office Action dated Feb. 29, 2012, Application No. 20101028496.26, r pages.

* cited by examiner

*Primary Examiner* — Kidest Bahta
(74) *Attorney, Agent, or Firm* — Haynes and Boone, LLP

(57) ABSTRACT

The present disclosure provides a semiconductor manufacturing method. The method includes providing product data of a product, the product data including a sensitive product parameter; searching existing products according to the sensitive product parameter to identify a relevant product from the existing products; determining an initial value of a processing model parameter to the product using corresponding data of the relevant product; assigning the initial value of the processing model parameter to a processing model associated with a manufacturing process; thereafter, tuning a processing recipe using the processing model; and performing the manufacturing process to a semiconductor wafer using the processing recipe.

20 Claims, 4 Drawing Sheets

ADVANCED PROCESS CONTROL FOR NEW TAPEOUT PRODUCT

BACKGROUND

Advanced process control (APC) is applied to semiconductor integrated circuit (IC) technology for manufacturing quality and efficiency, especially when semiconductor IC technology is continually progressing to circuit layouts having smaller feature sizes as well as increased density. During a semiconductor process with advanced process control, initial values of the parameters in the APC model are provided to start the APC process. In the existing method, the initial values of the APC model parameters are manually provided by engineers. A process engineer may manually assign the initial values based on experience or best guess estimates. However, the existing method is limited with several issues. There is higher chance that the guess can shoot far away from the target values. For example, a polysilicon etch model has only about 50% or less success rate. A second pilot run has to be added to the manufacturing cost if the first pilot run has failed. In another case, the process engineer may reach better initial values of the APC model by filtering more information and spending more time. Again, it is time consuming and the manufacturing cost is increased. Continued improvements to a semiconductor processing tool with advanced process control are therefore desired.

SUMMARY

The present disclosure provide a semiconductor manufacturing method. The method includes providing product data of a product, the product data including a sensitive product parameter; searching existing products according to the sensitive product parameter to identify a relevant product from the existing products; determining an initial value of a processing model parameter to the product using corresponding data of the relevant product; assigning the initial value of the processing model parameter to a processing model associated with a manufacturing process; thereafter, tuning a processing recipe using the processing model; and performing the manufacturing process to a semiconductor wafer using the processing recipe.

The present disclosure also provides another embodiment of a semiconductor manufacturing method. The method includes providing manufacturing data associated with a new product and a manufacturing process; searching existing products in a semiconductor manufacturer according to a product parameter from the manufacturing data to identify one relevant product from the existing products; determining an initial value of a processing model parameter to the new product using corresponding data of the relevant product; assigning the initial value of the processing model parameter to a processing model associated with a manufacturing process; tuning a processing recipe associated with the manufacturing process using the processing model; and performing the manufacturing process to a semiconductor wafer using the processing recipe.

The present disclosure also provides a semiconductor manufacturing system in one embodiment. The system includes a processing tool designed to perform a manufacturing process to semiconductor wafers; an advanced process control (APC) module configured to apply a processing model to the manufacturing process; and an new tapeout (NTO) module coupled with the APC module and configured to determine an initial value of a parameter to the processing model based on one sensitive product parameter.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
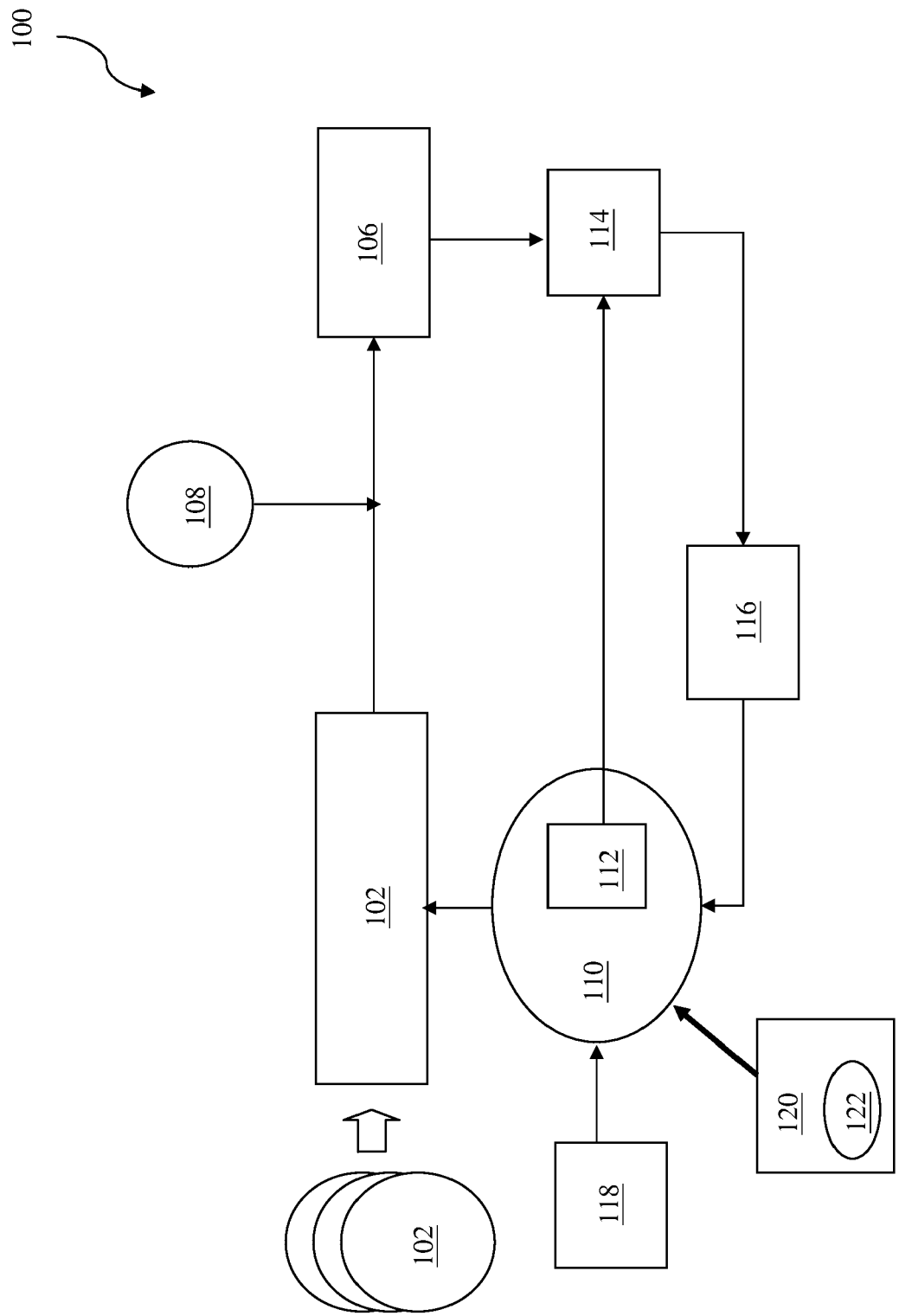
FIG. 1 is a schematic view of one embodiment of a semiconductor processing system constructed according to various aspects of the present disclosure.

Referring to FIG. 1, illustrated is a schematic view of one embodiment of a semiconductor processing system 100. The semiconductor processing system 100 and a semiconductor processing method implemented on the system 100 will be explained below in detail. The semiconductor processing system 100 includes an exemplary processing tool 102 designed to perform one semiconductor manufacturing process to one or more semiconductor wafers 104. The processing tool 102 is designed to perform the semiconductor manufacturing process, such as etch, deposition, thermal oxidation, implantation, lithography exposure, or ion implantation. In one embodiment, the processing tool 102 is an etching tool designed to etch polysilicon to form gate electrodes on a semiconductor wafer. In another embodiment, the processing tool 102 is an etching tool designed to etch trenches in a semiconductor substrate aimed to form shallow trench isolation (STI). In another embodiment, the etching tool is used to etch a dielectric layer to form trenches for further forming an interconnect structure in a damascene process.

In another embodiment, the processing tool 102 is a deposition tool, such as chemical vapor deposition (CVD) tool or physical vapor deposition (PVD) tool. For example, the CVD deposition tool is used to form a dielectric layer on a semiconductor wafer for isolation. In another example, the PVD tool is used to form a metal layer for interconnection. In another embodiment, the processing tool is an ion implantation tool to perform an ion implantation process to form one or more doped features, such as source/drain or wells, in the semiconductor substrate. In another embodiment, the processing tool is a chemical mechanical polishing (CMP) tool to polish a wafer to reduce the thickness variation and provide a planarized surface. In another embodiment, the processing tool is a lithography tool to expose an imaging layer on a wafer using a radiation energy in order to form the patterned imaging layer in assistance of other processing steps, such as etching, deposition, or ion implantation. In one example, the processing tool can be a cluster tool having multiple processing chambers with a same processing function or different processing functions. For example, a PVD tool may include four processing chambers, one used to form titanium nitride, one used to form titanium, and the other two used to form aluminum.

The semiconductor wafers (or wafers) 104 include silicon. Alternatively, the semiconductor wafers can be silicon germanium wafers or wafers of other proper semiconductor materials. The semiconductor wafers are in a semiconductor manufacturer for processing and may additionally include IC devices (such as transistors), interconnect structure, or a portion of those features. For example, the semiconductor wafers may include various doped features in silicon and may additionally include others features, such as gate electrodes and/or metal lines. The semiconductor wafers 104 are moved to the processing tool 102, a manufacturing process is applied to the wafers by the processing tool 102. Thereafter, the semiconductor wafers 104 are all or selectively sent to one or more metrology tool 106 for measurement to collect metrology data of the semiconductor wafers 104. In another embodiment, the metrology tool 106 is integrated with the processing tool 102 for online metrology data or in-situ metrology data. In various examples, the metrology data may include the thickness of a deposition film, etching depth of a material layer after etching, or the resistivity of a semiconductor layer after an ion implantation.

The metrology tool 106 may be one of electrical, optical, and/or analytical tools, such as microscopes, micro-analytical tools, line width measurement tools, particle distribution tools, surface analysis tools, stress analysis tools, resistivity and contact resistance measurement tools, mobility and carrier concentration measurement tools, junction depth measurement tools, film thickness measurement tools, gates oxide integrity test tools, C-V measurement tools, focused ion beam (FIB), and other test and measurement tools. In this particular case, the metrology tool 106 is capable to measure one or more relevant parameters of the wafers 104 after the manufacturing process is implemented by the processing tool 102. For example, when the processing tool 102 is an etch tool to etch trenches in the wafers, the metrology tool can be a tool capable of measuring the polysilicon thickness, polysilicon width, trench depth or trench width. In another example, when the processing tool is a deposition tool to form a material film on the wafers, the metrology tool can be a tool capable of measuring the film thickness. In another example, when the processing tool is an ion implantation tool to form various doped features in the wafers, the metrology tool can be a tool capable of measuring the doping concentration and/or resistance.

The semiconductor wafers 104 can be processed in the processing tool 102 in batch (such as one lot) or individually. During the manufacturing process applied to the semiconductor wafers 104 by the processing tool 102, various factors may contribute to the processing variation including noise 108 from the fluctuation of environment parameters, the drifting of the tool settings and other changes.

The manufacturing process is controlled by an advanced process control (APC) module (or controller) 110. The APC module 110 is designed to employ a processing model 112 to provide a process control utilizing the processing model and dynamically tune the processing model to catch the processing variation such that the processing model is aligned with current processing conditions associated with the processing tool 102. The APC module provides a process control to the processing tool 102 and tune the processing model according to the feedback and/or feed forward from the processing tool 102, metrology tool 106, and other processing tools. In one embodiment, a prediction to the processing result is provided by processing model 110 and is further compared with the measured result from the metrology tool 106 by a comparison module 114 to determine the difference between the measured result and the predicted result. The difference is further filtered by a filter module 116 to eliminate the random noise and to extract the systematic deviation between the predicted results from the processing model 110 and the measured results from the metrology tool 106. The deviation is then feed to the APC module 110 for tuning the processing model 112.

In one embodiment, the process model 112 is a component of the APC module 110 and is integrated with and implemented by the APC module 100. In another embodiment, the processing model 112 includes a mathematical equation to simulate the manufacturing process, to predict a product parameter of the wafers processed with the manufacturing process by the processing tool, and/or to determine a processing parameter used in the processing recipe associated with the manufacturing process and the processing tool 102. If the processing tool 102 is used to deposit a material layer to the wafers, one exemplary product parameter is the thickness of the deposited film. One exemplary processing parameter is deposition time. One exemplary example of the processing model is $T=ax+b$ where T is the thickness of the deposited film, x is the deposition time, and a and b are referred to as processing model parameters. The comparison step described above is to determine the difference between the predicted results from the processing model 110 and the measured results of the wafers that are processed by the processing tool 102 and measured by the metrology tool 106. The difference, after the filtering the noise, is fed back to the processing model to modify the processing model parameters (such as a and b in the above exemplary equation). Alternatively, the above equation $T=ax+b$ may present a processing model for an etching process implemented by an etching tool. In this case, T is removed film thickness by the etching process, x is the etching time, and the a and b are processing model parameters associated with the etching process. In one example, the processing model only includes one processing model parameter. Other complicated processing model may be present depending the characteristic of the manufacturing process implemented by the processing tool. In another example, one processing tool may implement multiple manufacturing processes for various purposes, each manufacturing process has a particular processing recipe and a particular processing model associated with that processing recipe. For example, an etching tool may have three etching processes, corresponding processing recipes and processing models. For example, processing recipes R1, R2, and R3 for the three etching processes, respectively.

In another embodiment, the APC module 110 further receives feed forward factors and parameters 118 from a previous process to determine the processing parameters associated with the processing model. In an example of an etching process, the feed forward factors and parameters may include, but not limited to, pattern critical dimension (CD), film thickness, and pattern profile. Those feed forward factors and parameters collectively contribute in determining the processing time. In furtherance of the example, based on the thickness of the film deposited in the previous processing step, the thickness to be removed (T) in the etching step by the current processing tool 102 is determined accordingly. Then the etching time x is then determined by the processing model 112. Accordingly, the APC module 110 may modify the etching time in the etching recipe. One or more wafers are processed by the etching tool 102 using the modified etching recipe in this example.

When a product is a new product in the semiconductor manufacturer, there are no history manufacturing data associated with this product. In one example, the design layout (tapeout) has to be sent to the mask shop to make a set of photomasks according to the design layout of the product. The new product is referred to as a new tapeout (NTO) product. For a NTO product, the processing model parameters (such as a and b) has to be initially assigned to the processing model to enable process control by the APC module 110. In the existing method, the initial values of the processing model parameters are manually provided by engineers. A process engineer may manually assign the initial values based on his experience or best guess estimates. However, there is a higher chance that the guess can shoot far away from the targets. For example, a polysilicon etch model has only about 50% success rate. In this case, a second pilot run has to be added to the manufacturing cost as the first pilot run failed to reach the correct processing model parameters within a certain range. In another case, the process engineer may get better initial values of the processing model parameters by analyzing and filtering more manufacturing information if spending more time. It is time consuming and increases the manufacturing cycle time. Again, the manufacturing cost is added up. Similar situation may exist for a product that has not been run for a long time, such as one month. The processing model previously used is out of date. The significant deviation of the processing model from the current processing conditions/settings associated with the processing tool renders the previous processing model parameters irrelevance to the present processing conditions/settings of the processing tool 102. Thus, the long-time-no-run product faces a similar situation of the NTO product. Initial values of the processing model parameters should be determined with high accuracy and cost effectiveness.

The present disclosure provides a NTO module 120 and a NTO method to effectively assign initial values of the processing model parameters for a new product or a long-time-no-run product, collectively referred to as an NTO product. The NTO module may further include an NTO database 122 or alternatively coupled with a database distributed in the semiconductor manufacturer. The NTO module 120 provides a mechanism to implement an NTO method to effectively determine the initial values of the processing model parameters. The NTO method is described in detail with reference to FIG. 2 as a flowchart of an NTO method 150 implemented by the NTO module 120 and constructed according to various aspects of the present disclosure. The NTO method 150 is initiated and implemented by the NTO module 120 when an NTO product is moved to the processing tool 102.

The NTO method 150 is described using an etching process as an example for illustration. In this case, the processing tool 102 is an etching tool. The NTO method 150 begins at step 152 by providing various product data of the NTO product to the NTO module 120. In one embodiment, the product data include customer code (such as customer ID and/or special requirement of the customer) if the customer of the NTO product is an existing customer. In another embodiment, the product data include recipe name of the processing recipe for the manufacturing process to be applied to the semiconductor wafers 104 by the processing tool 102. In another embodiment, the product data include parts ID (or product ID) if the product is a new product. In another embodiment, the product data include pattern density of a material layer before the manufacturing process. The pattern density is a relevant parameter in the etching process because the etching rate is impacted by the pattern density due to a load effect. In another embodiment, the product data include after-develop-inspection (ADI) target, such as ADI critical dimension (CD), and/or after-etching-inspection (AEI) target, such as AEI CD.

In another embodiment, the product data include effective time if the product is an existing product. The effective time defines a time gap of the existing product starting from the latest manufacturing date. If the time gap is more than the effective time, the previous data of the product are invalid and cannot be used since the previous data are out of date. In another embodiment, the product data include a pattern density specification S-pd to be used in the following steps. In this particular example, the parameter S-pd is defined as 3%. Here the parameter S-pd defines a maximum pattern density difference between this product and other existing products to be used in the following steps. If the manufacturing process is an etching process, the pattern density specification S-pd is used as a parameter to screen the existing products considering the etching process. Similarly, if the manufacturing process is a CMP process, a lithography process, or a deposition process, the pattern density specification S-pd may be used as well for the same purpose. Other parameter may be alternatively used to replace the S-pd based on the characteristic of the manufacturing process. In various embodiments, the product data may include a combination of the above described parameters or a subset thereof. Some parameters are adjustable based on the volume of the product pool (the number of the product types) and other factors. For example, the effective time may be adjusted shorter or longer according to the stability of the manufacturing process and the processing tool. The pattern density specification S-pd can be adjusted greater or less according to the etching sensitivity to the pattern density and/or the number of the product types.

The NTO method 150 proceeds to step 154 to perform a search to identify an existing product most close to the NTO product. The search can be applied to the existing products in a manufacturing database 156. The manufacturing database 156 may include a plurality of sub-databases and can be distributed in the semiconductor manufacturer and coupled/interacted with the NTO module 120 through an intranet or the Internet.

Various product parameters of the existing products may be employed to perform the search to the existing products. The product parameters of an existing product are associated with the manufacturing process (an etching process in this particular example). The usage of the product parameters in the search is further explained.

In the searching process, one or more search rules are applied to the existing products in the manufacturing database to determine one or more relevant products. The relevant products will be used to determine the initial values of the processing model parameters during the following steps. The search rules are defined based on the provided product parameter. In one embodiment, a product parameter sensitive to the semiconductor manufacturing process is chosen and used for the searching. In an example of an etching process, the pattern density is used for that purpose since the etching process is sensitive to the pattern density due to a loading effect. For example, an existing product is qualified as a relevant product if its pattern density is close to the pattern density of the NTO product with a difference less than the parameter S-pd. For example, if one existing product has a pattern density different from the pattern density of the NTO product by less than 3%, this existing product will be considered as a relevant product and will be used to determine the initial values of the processing model parameters at a following step. Another parameter, such as recipe name, is additionally used. For example, an existing product is qualified as a relevant product if the recipe (identified by the recipe name) is the same recipe used to the NTO product and the pattern density is close to the pattern density of the NTO product with a difference less than the parameter S-pd. In one embodiment, the search action is applied to the existing products to identify a relevant product having equal or most close pattern density and the same processing recipe.

In other embodiments, a combination of pattern density, processing recipe, customer code is used for the search. These data can be obtained from the manufacturing database. For example, the pattern density may be extracted from the corresponding etching photomask in a mask database. Usually, there are multiple processing recipes used in the processing tool 102. For example, there may be three etching recipes used in the processing tool 102 for polysilicon etching. Each etching recipe is associated with one processing model utilized by the APC module 110. So the processing recipe (or recipe name) is also a relevant parameter for the search.

The search action is implemented through an iterative procedure. The search action is iterated until one or more relevant products are identified. In each cycle of the searching, the sensitive parameter is changed to extend the search pool. The search action may start by searching the existing products having the same recipe and having a pattern density different from that of the NTO product within an initial pattern density difference, such as 1%. Thus, the first search action is implemented to search the existing products with the same recipe and with a pattern density difference less than 1%.

After the completion of the above search, the method 150 proceeds to step 158 by checking if the above search action finds at least one existing product satisfying the above criteria (e.g., same recipe and pattern density difference less than 1%). If one or more existing products are thus identified, the method 150 proceeds to step 160.

At step 160, if the above search identified one relevant product, the values of the processing model parameters of the identified relevant product are assigned as the initial values of the processing model parameters of the NTO product. If more than one existing products are identified, an average procedure is implemented to determine the initial values of the processing model of the NTO product. For example, the initial value of the processing model parameter "a" equals to an average of the processing model parameter "a" over those identified relevant products. In furtherance of the example, the initial value of processing model parameter "a" of the NTO equals (a1+a2, + . . . +an)/n, wherein n is the number of the identified existing products, "a1", "a2", . . . , and "an" are corresponding values of the processing model parameter "a" of the relevant products. In another embodiment, the average procedure is implemented with a weighting factor. For example, the weighting factor considers the idle time (time gap from the latest run date), pattern density, or combination thereof. If one relevant product has a shorter idle time, the weighting factor will be greater. If one relevant product has a pattern density closer to the pattern density of the NTO product, the weighting factor will be greater. The determined initial values of the processing model parameters of the NTO product are then provided to the APC module 110.

Back to step 158, if no relevant product is successfully identified, then a new cycle of search action is applied and extended to a larger pool of existing products. In one embodiment, a pattern density increment is defined and is used in the iterative search procedure. For example, the pattern density increment is defined as 1%. If no relevant product is identified, the method 150 proceeds to step 162 to increase the pattern density difference by the pattern density increment (e.g. 1%). A new pattern density difference is the sum of the initial pattern density difference and the pattern density increment. For example, the new pattern density difference is 2%. The new pattern density difference is further checked if it is beyond the pattern density specification S-pd (the maximum range). If it does, the method proceeds to step 164 to put the search on hold. In this case, a process engineer may be involved to take actions, such as change the search rules. If the new pattern density difference is still within the pattern density specification S-pd, the method 150 return to step 154 to perform a new search to the existing products using the new pattern density difference. In this example, the new pattern density difference is 2%. More particularly, the new search is applied to identify the existing products with the same recipe and a pattern density different from the pattern density of the NTO product by less than 2%.

Other rules may be incorporated in the search action at step 154. For example, the idle time may be additionally applied. If an existing product has an idle time longer than the effective time, this product will be screened out. In another example, the search may start by searching the products with the same customer code. If the existing products are exhausted without identifying any, the search action is then extended to the other existing products with different customer code. The search to the other existing products may start similarly from the initial pattern density difference (e.g. 1%). The search action to the other existing products with different customer code takes an iterative procedure (steps 154, 158, 160, 162 and 164) similar to the search procedure applied to the existing products with the same customer code. For example, if the other existing products with a pattern density difference less than 1% is exhausted without yield, then the method 150 proceeds to step 162 to increase to the pattern density difference by the pattern density increment. For example, the increased pattern density difference is 2%. The method 150 returns to step 154 for another cycle of search for the other existing products with the pattern density difference less than 2%. If one or more other existing products with different customer code are identified, the method proceeds to step 160 to determine the initial values of the processing model parameters similar to the above description regarding step 160.

The initial values of the processing model parameters determined by the NTO method 150 have higher quality, such as precise and closer to the target. In addition, the method 150 is cost-effective and can be automatically implemented without the engineer involvement in an usual situation. Other advantages and benefits may present in various embodiments of the disclosed NTO method and the semiconductor manufacturing system. In one example, the successful rate of the initial values of the processing model parameters for an polysilicon etching process is enhanced from about 50% to about 80%. In another example, a shorter manufacturing cycle time is achieved with a reduced cost. In another example, the semiconductor manufacturing system of FIG. 1 and the NTO method of FIG. 2 can meet challenging requirements of 450 mm wafer mass production. It is understood that different embodiments disclosed herein offer different advantages and that no particular advantage is necessarily required in all embodiments.

Figure 3B:
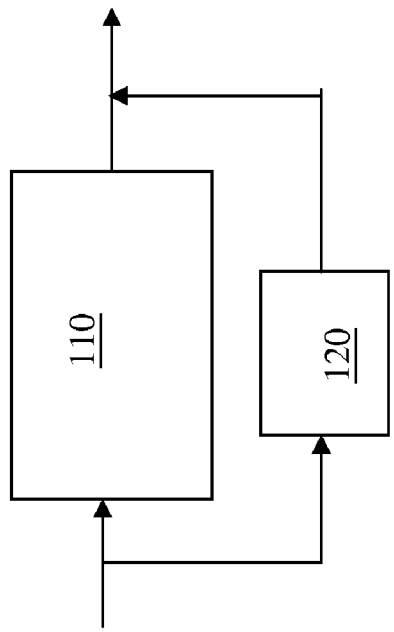
FIGS. 3a through 3d are block diagrams of an interaction mechanism of an APC module and an NTO module constructed according to various aspects of one embodiment of the present disclosure in several embodiments.
Figure 3A:
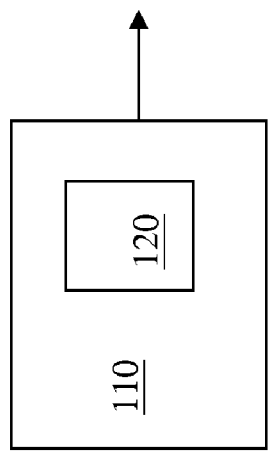
Figure 3D:
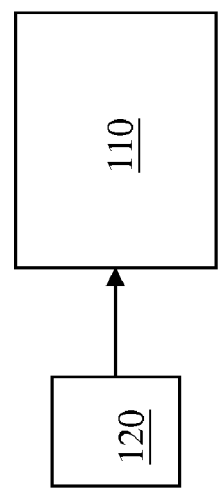
Figure 3C:
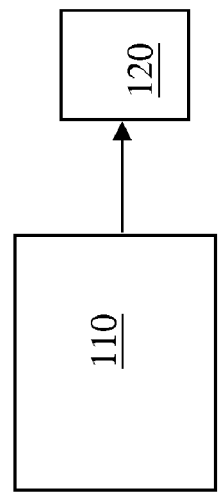

Although described above in various embodiments, the semiconductor processing system 100, the semiconductor processing method, the NTO module 120, and the NTO method can be modified or extended without departure of the spirit and scope of the present disclosure. For example, in the semiconductor processing system 100 and the APC method, the interaction mechanism between the APC module 110 and the NTO module 120 may implement various alternatives illustrated in FIGS. 3a through 3d. FIGS. 3a through 3d are block diagrams of an interaction mechanism of the APC module and the NTO module constructed according to various aspects of the present disclosure in various embodiments. In one embodiment, the NTO module 120 is embedded in and integrated with the APC module 110, as illustrated in FIG. 3a. In this case, if the product does not have an effective processing model (no processing model or the processing model is invalid), then the APC module 110 will call the NTO module 120 to request the initial values of the processing model parameters. In another embodiment, the NTO module 120 and the APC module 110 are in a parallel interaction mechanism as illustrated in FIG. 3b. In this case, if the product has an effective processing model, the semiconductor processing method will go to the APC module 110 for process control. Otherwise, the semiconductor processing method will go to the NTO module 120 for the initial values of the processing model parameters. In another embodiment, the NTO module 120 and the APC module 110 are in a series interaction mechanism, such as one illustrated in FIG. 3c or another illustrated in FIG. 3d. In FIG. 3c, if the APC module 110 identifies that the product does not have an effective processing model, then the APC module 110 will trigger the NTO module 120 for the initial values of the processing model parameters. In FIG. 3d, the NTO module 120 assigns initial values of the processing model parameters and then the semiconductor processing method goes to the APC module 110 for process control. After the completion of the manufacturing process in the processing tool 102, the semiconductor wafers 104 are moved for a subsequent manufacturing process.

The pattern density is used as a sensitive product parameter to search existing products to determine the initial values of the processing model parameters to an etching process. However, other sensitive product parameter may be used for this purpose. Accordingly, the pattern density specification is replaced by a specification of the new sensitive product parameter.

Figure 4:
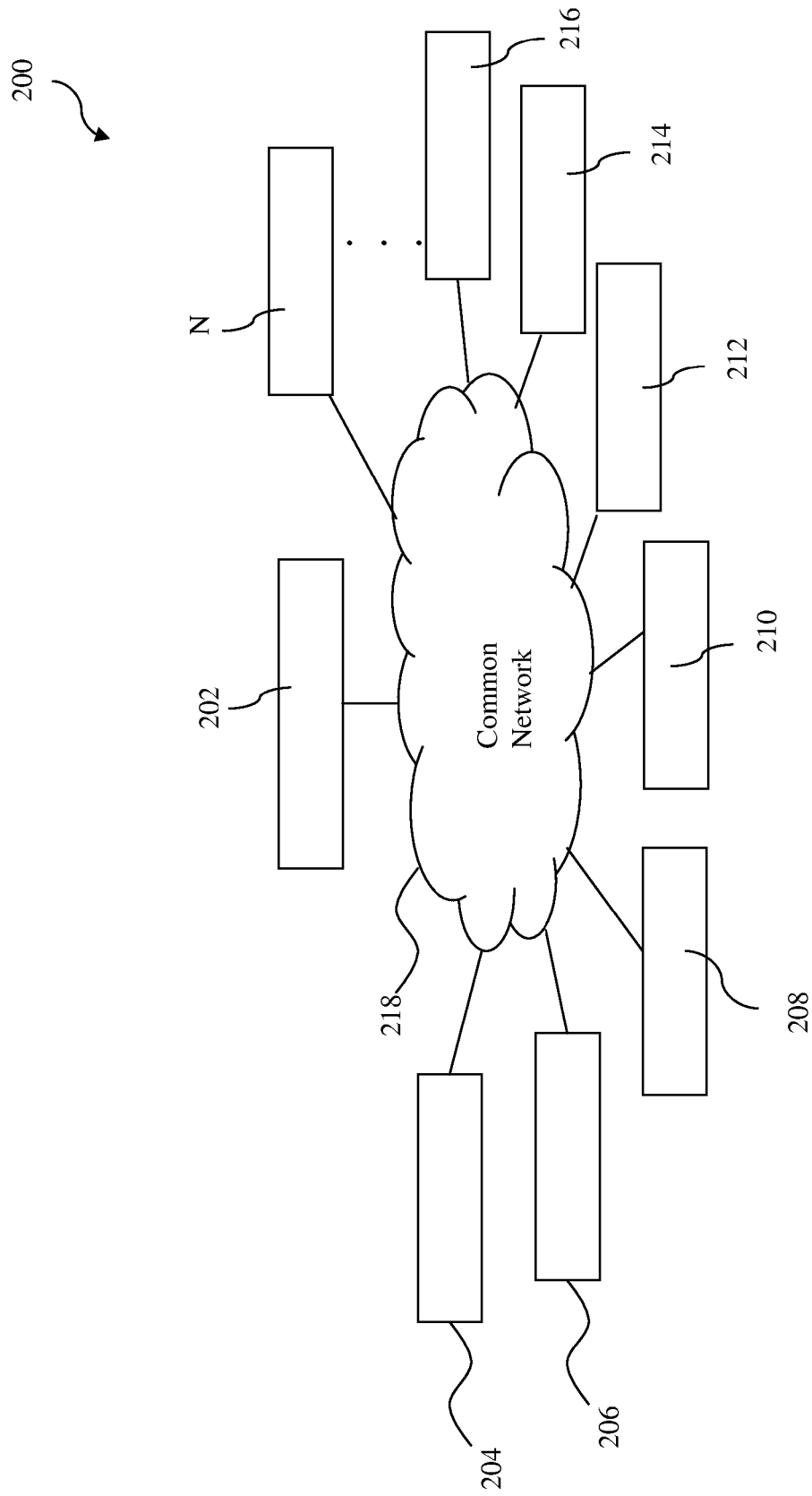
FIG. 4 is a block diagram of a semiconductor fabrication system within which the semiconductor processing system of FIG. 1 can be utilized.

FIG. 4 illustrates an integrated circuit fabrication system 200 within which the semiconductor processing system 100 of FIG. 1 may be utilized or distributed therein. The fabrication system 200 includes a plurality of entities 202, 204, 206, 208, 210, 212, 214, 216 . . . , N that are connected by a communications network 218. The network 218 may be a single network or may be a variety of different networks, such as an intranet and the Internet, and may include both wireline and wireless communication channels.

Figure 2:
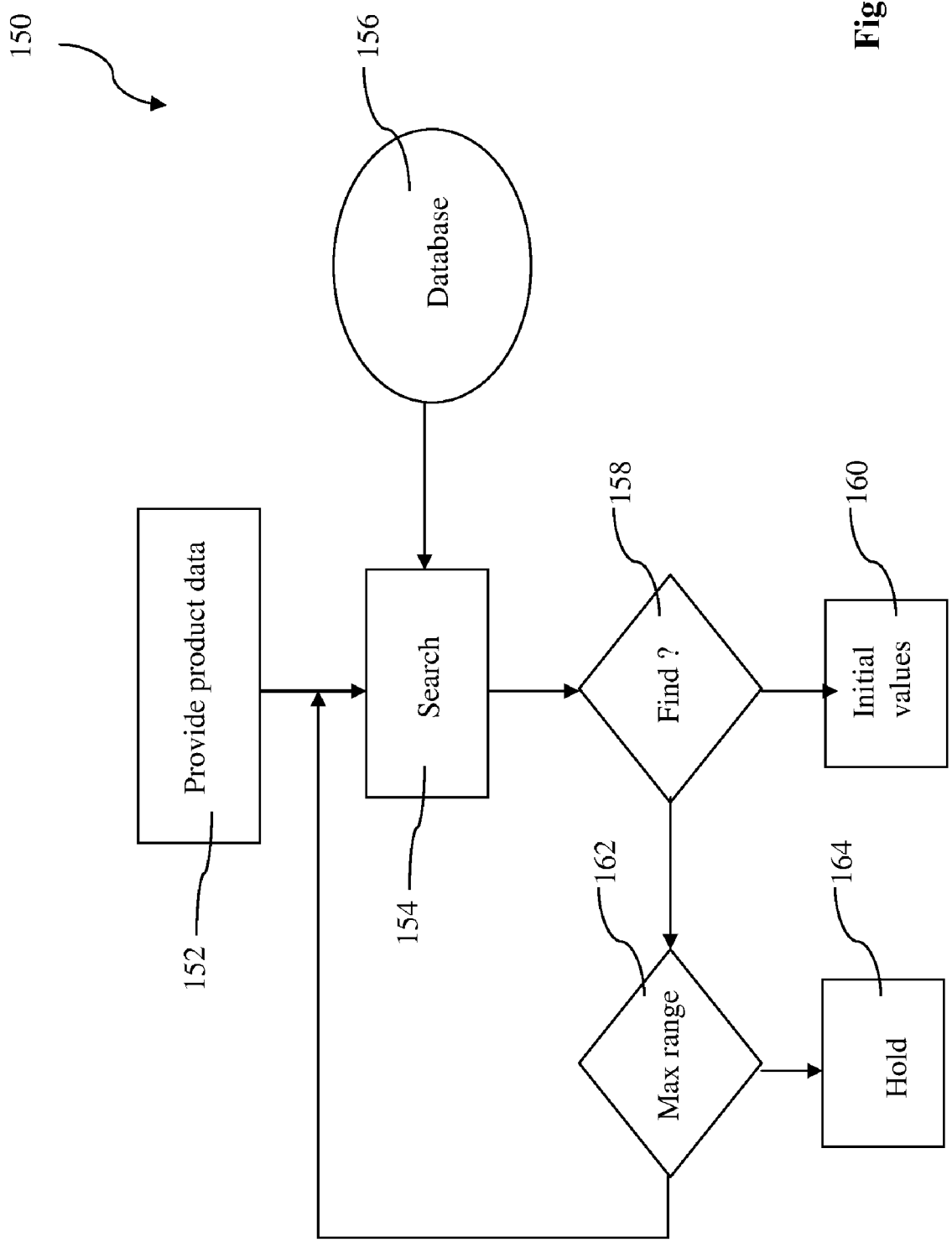
FIG. 2 is a flowchart of an new tapeout (NTO) method implemented in the semiconductor processing system of FIG. 1 and constructed according to various aspects of one embodiment of the present disclosure.

In the present example, the entity 202 represents photomask manufacturing facility designed to make photomasks having predefined circuit patterns, the entity 204 represents an user, such as product engineer monitoring the interested products, the entity 206 represents an engineer, such as a processing engineer to control process and the relevant recipes, or an equipment engineer to monitor or tune the conditions and settings of processing tools, the entity 208 represents a metrology tool for IC testing and measurement, the entity 210 represents a semiconductor processing tool, such as the processing tool 102 of FIG. 1, the entity 212 represents an advanced processing control (APC) module associated with the processing tool 210 to provide process control, such as the APC module 110 of FIG. 1, the entity 214 represents an NTO module associated with the processing tool 210 to provide initial values of the processing model parameters, such as the NTO module 120 of FIG. 1, and the entity 216 represents a manufacturing database, such as the database 156 of FIG. 2. Each entity may interact with other entities and may provide integrated circuit fabrication, processing control, and/or calculating the initial values of the processing model parameters to an NTO product.

The integrated circuit fabrication system 200 enables interaction among the entities for the purpose of integrated circuit (IC) manufacturing, as well as the advanced processing control of the IC manufacturing. In various embodiments, the APC module 212 is integrated, coupled, or interacted with the NTO module 214 in different ways, such as those illustrated in FIGS. 3a through 3d. The interaction between the APC module 212 and the NTO module 214 provide a mechanism to implement and enable an NTO method to effectively determine the initial values of the processing model parameters based on the product data.

One of the capabilities provided by the IC fabrication system 200 may enable collaboration and information access in such areas as design, engineering, and processing, metrology, and advanced processing control. Another capability provided by the IC fabrication system 200 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The present disclosure provides various embodiments of a semiconductor processing system and a method to utilize the processing system. Other variations may also be possible within the scope of the invention. In one embodiment, various steps of the NTO method 150 may be implemented at a different sequence.

Thus, the present disclosure provide a semiconductor manufacturing method. The method includes providing product data of a product, the product data including a sensitive product parameter; searching existing products according to the sensitive product parameter to identify one relevant product from the existing products; determining an initial value of a processing model parameter to the product using corresponding data of the relevant product; assigning the initial value of the processing model parameter to a processing model associated with a manufacturing process; thereafter, tuning a processing recipe using the processing model; and performing the manufacturing process to a semiconductor wafer using the processing recipe.

In various embodiments of the method, the product is one of new product and long-time-no-run product. The product data may include ones selected from the group consisting of recipe name, customer code, product identification (ID), effective time, sensitive product parameter specification, after develop inspection (ADI) target, after etching inspection (AEI) target, and combinations thereof. In one embodiment, the sensitive product parameter is pattern density. In another embodiment, the manufacturing process includes an etching process. In other embodiments, the manufacturing process includes a process selected from the group consisting of etching, deposition, thermal oxidation, ion implantation, lithography process, and chemical mechanical planarizing (CMP). The searching of the existing products includes performing a first search action to the existing products according to the sensitive product parameter in a first range; and performing a second search action to the existing products according to the sensitive product parameter in a second range. In one embodiment, the searching of the existing products includes searching the existing products additionally according to another product parameter. For example, the another product parameter is recipe name. In one embodiment, the determining of the initial value includes applying an average procedure if multiple relevant products are identified in the searching of the existing products.

The present disclosure also provides another embodiment of a semiconductor manufacturing method. The method includes providing manufacturing data associated with a new product and a manufacturing process; searching existing products in a semiconductor manufacturer according to a product parameter from the manufacturing data to identify one relevant product from the existing products; determining an initial value of a processing model parameter to the new product using corresponding data of the relevant product; assigning the initial value of the processing model parameter to a processing model associated with a manufacturing process; tuning a processing recipe associated with the manufacturing process using the processing model; and performing the manufacturing process to a semiconductor wafer using the processing recipe.

In one embodiment, the product parameter includes a product parameter sensitive to the manufacturing process. In another embodiment, the manufacturing process includes an etching process. In another embodiment, the product parameter includes a pattern density of a material layer on the semiconductor wafer and the manufacturing process is applied to the material layer.

The present disclosure also provides a semiconductor manufacturing system in one embodiment. The system includes a processing tool designed to perform a manufacturing process to semiconductor wafers; an advanced process control (APC) module configured to apply a processing model to the manufacturing process; and an new tapeout (NTO) module coupled with the APC module and configured to determine an initial value of a parameter to the processing model based on one sensitive product.

In one embodiment, the system further includes a metrology tool designed and configured to measure one or more of the semiconductor wafers. In another embodiment, the system further includes a filter to eliminate noise from a comparison result between a parameter from the metrology tool and a corresponding value from the processing model. In various embodiment, the NTO module may be embedded in the APC module. The NTO module may be integrated with the APC module in one mode selected from the group consisting of parallel and series. In another embodiment, the processing tool is an etching tool.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor manufacturing method, comprising:
providing product data of a product, the product data including a sensitive product parameter;
searching existing products according to the sensitive product parameter to identify a relevant product from the existing products;
determining an initial value of a processing model parameter to the product using corresponding data of the relevant product;
assigning the initial value of the processing model parameter to a processing model associated with a manufacturing process;
thereafter, tuning a processing recipe using the processing model; and
performing the manufacturing process to a semiconductor wafer using the processing recipe.

2. The method of claim 1, wherein the product is one of a new product and long-time-no-run product.

3. The method of claim 1, wherein the product data comprise a type selected from the group consisting of a recipe name, a customer code, a product identification (ID), an effective time, a sensitive product parameter specification, an after develop inspection (ADI) target, an after etching inspection (AEI) target, and combinations thereof.

4. The method of claim 1, wherein the sensitive product parameter is a pattern density.

5. The method of claim 1, wherein the manufacturing process comprises an etching process.

6. The method of claim 1, wherein the manufacturing process comprises a process selected from the group consisting of etching, deposition, thermal oxidation, ion implantation, lithography process, and chemical mechanical planarizing (CMP).

7. The method of claim 1, wherein the searching of the existing products comprises:
performing a first search action to the existing products according to the sensitive product parameter in a first range; and
performing a second search action to the existing products according to the sensitive product parameter in a second range.

8. The method of claim 1, wherein the searching of the existing products comprises searching the existing products additionally according to another product parameter.

9. The method of claim 8, wherein the another product parameter is a recipe name.

10. The method of claim 1, wherein the determining of the initial value comprises applying an average procedure if multiple relevant products are identified in the searching of the existing products.

11. A semiconductor manufacturing method, comprising:
providing manufacturing data associated with a new product and a manufacturing process;
searching existing products in a semiconductor manufacturer according to a product parameter from the manufacturing data to identify one relevant product from existing products;
determining an initial value of a processing model parameter to the new product using corresponding data of the relevant product;
assigning the initial value of the processing model parameter to a processing model associated with a manufacturing process;
tuning a processing recipe associated with the manufacturing process using the processing model; and performing the manufacturing process to a semiconductor wafer using the processing recipe.

12. The method of claim 11, wherein the product parameter comprises a product parameter sensitive to the manufacturing process.

13. The method of claim 11, wherein the manufacturing process comprises an etching process.

14. The method of claim 11, wherein the product parameter comprises a pattern density of a material layer on the semiconductor wafer and the manufacturing process is applied to the material layer.

15. A semiconductor manufacturing system, comprising:
a processing tool designed to perform a manufacturing process on semiconductor wafers to form a new tapeout (NTO) product, the NTO product having a first value of a sensitive product parameter;
an advanced process control (APC) module configured to apply a processing model to the manufacturing process, the processing model including a processing model parameter; and
an NTO module coupled with the APC module and configured to determine an initial value of the processing model parameter based on an existing product having a second value of the sensitive product parameter that is within a threshold of the first value.

16. The system of claim 15, further comprising a metrology tool designed and configured to measure one or more of the semiconductor wafers.

17. The system of claim 16, further comprising a filter to eliminate noise from a comparison result between a parameter from the metrology tool and a corresponding value from the processing model.

18. The system of claim 15, wherein the NTO module is embedded in the APC module.

19. The system of claim 15, wherein the NTO module is integrated with the APC module in one mode selected from the group consisting of parallel and series.

20. The system of claim 15, wherein the processing tool is an etching tool.

* * * * *